TRANSISTOR AMPLIFIER

Filed Oct. 7, 1964

INVENTOR
Hung C. Lin
BY Dean Schron
ATTORNEY

United States Patent Office 3,378,780
Patented Apr. 16, 1968

3,378,780

TRANSISTOR AMPLIFIER

Hung C. Lin, Silver Spring, Md., assignor to Westinghouse Electric Corporation, East Pittsburgh, Pa., a corporation of Pennsylvania Filed Oct. 7, 1964, Ser. No. 402,172
9 Claims. (Cl. 330—24)

ABSTRACT OF THE DISCLOSURE

A high input-low output impedance buffer amplifier includes an input transistor stage providing an output signal to a phase inverting transistor stage from which an output signal is provided at an output terminal. Connected between the output terminal and the input stage is a transistor feedback stage to provide a feedback signal to the input stage. Each of the transistors is located in a respective current path having a respective resistance and diode(s) to compensate for various base emitter voltage drops. The input and feedback transistor stages each have an emitter electrode connected to a common point with a resistor connected between ground potential and the common point and for faithful reproduction of the input signal in both phase and amplitude the values of the resistors bear a particular relationship.

This invention in general relates to transistor amplifier circuits, and more particular to a stabilized buffer amplifier.

The purpose of a buffer amplifier is to provide good isolation between a source and a load having substantially different impedances.

In various electronic circuits it is necessary to isolate a high impedance signal source from a low impedance load so that loading has negligible effect on the source, and to this end a high input-low output impedance buffer amplifier is utilized. In addition to the isolation function, the buffer amplifier must, in certain circumstances, provide the exact signal as received, which signal in many instances is a DC or slowly varying DC signal. Because of DC characteristic changes of various elements of the buffer amplifier due to temperature variations, aging variations, etc., it is difficult to make buffer amplifiers which meet the high input impedance-low output impedance and output signal criteria.

It is therefore an object of the present invention to provide an extremely stable buffer amplifier.

It is another object to provide a buffer amplifier which provides an output signal identical to its input signal.

It is a further object to provide an amplifier circuit particularly well adapted to be fabricated by integrated circuit techniques.

Briefly, the amplifier of the present invention includes an input stage, which provides an out-of-phase output signal, a phase inverter stage responsive to the out-of-phase output signal from the input stage for providing an in-phase signal and a feedback stage responsive to the phase inverter output for providing a feedback signal to the input stage. A first and second transistor, constituting the input and feedback stage respectively have their emitters commonly connected to a common resistor with the output of the first transistor being fed to the input of a third transistor constituting the phase inverter stage and having an output electrode connected to an output junction. The second transistor has its base connected to the output junction and a circuit including an impedance connects the output junction and a point of common references potential.

A first resistor is connected in the collector-emitter current path of the first transistor, a resistor is connected in the emitter-colector current path of the third transistor and a resistor is connected between the output junction and the point of common reference potential. In order to have the output signal faithfully follow the input signal the values of the resistors bear a relation such that twice the value of the common resistor times the value of the resistor in the emitter-collector path of the third transistor is equal to the value of the resistor in the collector-emitter path of the first transistor times the value of the resistor connected between the output junction and the point of reference potential.

To compensate for variations in the base to emitter voltage drops of the various transistors used in the amplifier, there are provided compensating means in the form of diodes in the various current paths of the circuit.

The aforementioned as well as other objects and advantages will be apparent after a study of the following detailed specification taken in conjunction with the drawings, in which.

Figure 1:
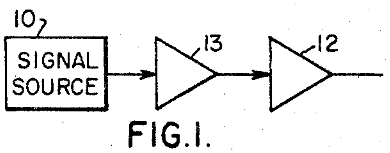
FIGURE 1 illustrates an arrangement requiring the use of a buffer amplifier.

Referring now to FIG. 1, there is shown a signal source 10 which may, for example, be some sort of a transducer having a very high output impedance in the order of megohms and which provides an output signal proportional to some physical quantity being measured. The value of this physical quantity, such as pressure, temperature, stress, strain, etc. is to be amplified by amplifier 12, the output signal of which, for example, is used for control or telemetry purposes. Since the high output impedance of the transducer 10 does not match the relatively lower input impedance of the amplifier 12, there is provided the buffer amplifier 13 which provides proper isolation by presenting a high impedance to the transducer 10 and a low output impedance to the amplifier 12.

Figure 2:
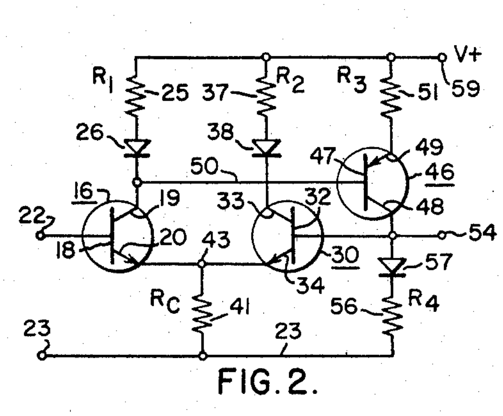
FIG. 2 illustrates an embodiment of the present invention.

FIG. 2 illustrates an embodiment of the buffer amplifier of the present invention. The buffer amplifier of FIG. 2 includes a first signal translating device in the form of transistor 16 having an input or base electrode 18, an output or collector electrode 19 and a common or emitter electrode 20. Input signals such as may be provided by the transducer 10 of FIG. 1 are applied to input terminals 22 and 23, the latter constituting a point of reference potential which may be ground potential, or some negative potential, depending upon the particular application and the voltage range of signals received. The output signal provided at the collector 19 is 180° out of phase with the input signal. With a negative point of reference potential the input signals may be applied between input terminal 22 and ground potential. The collector-emitter current path of transistor 16 is serially connected with a current path including a first resistor 25 and first diode 26. A second signal translating device in the form of feedback transistor 30 is provided and includes input or base electrode 32, output or collector electrode 33 and common or emitter electrode 34. Serially connected in the collector-emitter current path of the transistor 30 is a second current path including a second resistor 37 and a second diode 38.

The first current path comprising resistor 25, diode 26 and transistor 16 and the second current path comprising resistor 37, diode 38 and transistor 30 have a commonly included resistor 41. More explicitly, in the embodiment of the invention shown in FIG. 2, each of the emitters 20 and 34 are connected to a common point 43 and the common resistor 41 is connected to the common point 43 and the point of reference potential 23.

A third signal translating device in the form of phase inverter transistor 46 includes base electrode 47, collector electrode 48 and emitter electrode 49. Transistor 46 is operable to receive the out-of-phase output signal provided by transistor 16 by way of lead means 50. Serially connected in the emitter-collector current path of transistor 46 is a third resistor 51. The output signal provided by the phase inverter transistor 46 is in phase with the input signal and may be fed to a subsequent circuitry at output junction 54 which is electrically connected to both the collector 48 of transistor 46 and the base 32 of transistor 30. Circuit means in the form of a fourth resistor 56 and third diode 57 is connected between the output junction 54 and the point of reference potential 23.

The signal appearing at collector 19 is herein termed the out-of-phase signal and the signal appearing at collector 48 of phase inverter transistor 46 is the in-phase signal since it is in phase with the input signal due to a double reversal of phase of the input signal by transistors 16 and 46. Bias terminal 59 is connected to a suitable source of operating potential V+ in order to properly bias the various transistors of the circuit.

For use as a buffer amplifier, the circuit of FIG. 2 requires that the output voltage at the output junction 54 be identical to the input voltage at input terminal 22. In order to better stabilize the circuit with respect to drift due to temperature variations it is preferable that the amplifier be fabricated as an integrated circuit so that, amongst other things, the base to emitter voltage drop of transistor 16 is substantially identical with the base to emitter voltage drop of transistor 30. In the absence of an integrated circuit it is necessary to substantially match the characteristics of these two transistors.

In order to have the output voltage identical to the input voltage a certain relationship exists between the values of the various resistors, and basically is as follows:

Electrically, there are two current paths from V+ to the collector 19 of transistor 16. One current path includes resistor 25, which will be called $R_1$, and through the diode 26, and other path is from V+ through resistor 51, which will be called $R_3$ and through the emitter-base diode of transistor 46. Since these two current paths are in parallel the following relationship holds true $$V+-I_{c1}R_1-V_{D1}=V+-I_{e3}R_3-V_{BE3} \qquad (1)$$

where $I_{c1}$=collector current of transistor 16
$V_{D1}$=voltage drop across diode 26
$I_{e3}$=emitter current of transistor 46
$V_{BE3}$=base-emitter voltage drop of transistor 46

The diode 26 is a compensating diode having the same voltage drop as the base-emitter voltage drop of transistor 46 and preferably made out of the same semiconductor materials as the transistor 46 so that any temperature variations causing a varying base-emitter voltage drop of transistor 46 will be offset by the corresponding voltage drop across diode 26. From Equation 1, since $V+=V+$ and $V_{D1}=V_{BE3}$;

$$I_{e3}=\frac{I_{c1}R_1}{R_3} \qquad (2)$$

The collector current $I_{c3}$ of transistor 46 divides at output junction 54 and part flows into the base 32 as base current $I_{B2}$ and part flows through resistor 56, herein termed $R_4$. The current through the $R_4$ branch is I. Since the base current $I_{B2}$ is small compared with the collector current $I_{c3}$, it may be assumed that:

$$I_{c3}=\delta \qquad (3)$$

From output junction 54 to the point of reference potential 23, there is established two parallel paths. One path includes the diode 57 (D3) and resistor R4 and the other path includes the base-emitter voltage drop $V_{BE2}$ of transistor 30 and the common resistor $R_c$. Since these two paths are in parallel the voltage from output junction 54 to point 23 is the same for both paths.

$$V_{54}-V_{D3}-IR_4=V_{54}-V_{BE2}-I_cR_c \qquad (4)$$

where $V_{54}$=output voltage at output junction 54

$I_c$=total current flowing through $R_c$ from Equation 4, since $V_{54}=V_{54}$ and $V_{D3}=V_{BE2}$;

$$IR_4=I_cR_c \qquad (5)$$

$I_c$ is the total current through $R_c$ and is comprised of the emitter currents $I_{e1}$ and $I_{e2}$ of transistors 16 and 30 so;

$$IR_4=(I_{e1}+I_{e2})R_c \qquad (6)$$

from Equation 3

$$I_{c3}R_4=(I_{e1}+I_{e2})R_c \qquad (7)$$

for proper operation the emitter currents $I_{e1}$ and $I_{e2}$ should be equal. In order to derive the proper value relationships of the resistors in the circuit $I_{e1}$ will be made equal to $I_{e2}$ so Equation 7 is:

$$I_{c3}R_4=2I_{e2}R_c \qquad (8)$$

Each of the transistors used is a high gain transistor and consequently it may be assumed that the emitter current is approximately equal to the collector current:

$$I_{c1}=I_{e1}$$
$$I_{c2}=I_{e2}$$
$$I_{c3}=I_{e3}$$

from the above and Equation 2, replacing terms in Equation 8:

$$I_{e3}R_4=2I_{c2}R_c$$
$$\frac{I_{c1}R_1R_4}{R_3}=2I_{c2}R_c \qquad (9)$$

Since $$I_{c1}=I_{B1}h_{fe1}$$

and $$I_{c2}=I_{B2}h_{fe2}$$

(where $h_{fe}$ is the common emitter forward current gain) Equation 9 becomes:

$$\frac{I_{B1}h_{fe1}R_1R_4}{R_3}=2I_{B2}h_{fe2}R_c \qquad (10)$$

$$\frac{I_{B1}}{I_{B2}}=\frac{2h_{fe2}R_cR_3}{h_{fe1}R_1R_4} \qquad (11)$$

Equation 11 sets forth the relation of the base currents $I_{B1}$ and $I_{B2}$. If these base currents are identical, that is $I_{B1}/I_{B2}=1$, the base-emitter voltage drops should be equal and therefore the input voltage and output voltage will be the same, a necessary operation of the buffer amplifier as before stated. With transistors 16 and 30 as identical as possible, as by fabrication on the same monolithic integrated circuit block, the forward current gains should be equal.

With $I_{B1}/I_{B2}=1$ and $h_{fe1}=h_{fe2}$, Equation 11 reduces to:

$$R_1R_4=2R_cR_3 \qquad (12)$$

Equation 12 therefore sets out the relationship between the resistors in order to have the output signal equal to the input signal. The value of resistor 25 multiplied by the value of resistor 56 should substantially equal twice the value of resistor 41 times resistor 51.

In order to enhance the likelihood of equal forward current gains for transistors 16 and 30 both of these transistors should have the same collector voltage. To insure that transistor 30 has the same collector voltage as transistor 16, the second current path includes resistor 37 equal in value to resistor 25 and diode 38 similar to diode 26.

With an input signal appearing at the base of transistor 16, a corresponding and equal output signal is provided at output junction 54 and is equal to the base-emitter voltage drop of transistor 30 plus the voltage drop across the common resistor 41. If the output signal at output junction 54 increases from the value determined by the input signal, there will be a corresponding increase in base current to transistor 30 tending to increase its collector and emitter current. This increase in emitter current flowing through common resistor 41 produces a feedback signal to the emitter 20 of transistor 16 tending to decrease the output signal thereof which coupled to transistor 46 reduces the output signal at output junction 54. In similar fashion a decrease in output signal will cause a corrective action to increase the output signal from transistor 16. It is seen therefore that with the resistors having values as defined in Equation 12, the buffer amplifier of FIG. 2 will function to provide an output signal identical to the input signal and maintain the identical correspondence by action of the feedback transistor 30.

The buffer amplifier of FIG. 2 has a very high input impedance determined by the common resistor 41 and it may be demonstrated that when the base currents of transistors 16 and 30 are equal, $$R_{\text{input}}=(h_{\text{fe1}}+h_{\text{fe2}})R_c=2h_{\text{fe1}}R_c$$

Figure 3:
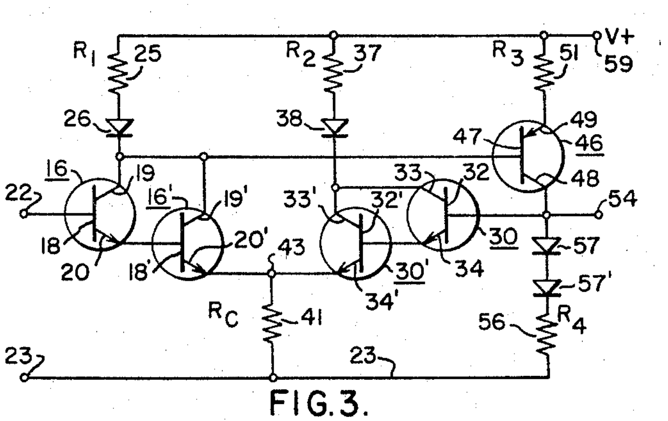
FIG. 3 illustrates another embodiment of the present invention.

The circuit shown in FIG. 2 may be modified to further improve the performance and to this end reference should be made to FIG. 3.

The buffer amplifier of FIG. 3 is similar to the buffer amplifier in FIG. 2 and like circuit components have like reference numerals. The modification shown in FIG. 3 has the input and feedback stages (transistors 16 and 30 respectively of FIG. 2) replaced by amplifiers utilizing transistors having their collector electrodes connected together with the emitter of a previous transistor being connected to the base of a subsequent transistor. This type of configuration is generally termed a Darlington amplifier which has the effect of greatly increasing the input resistance.

The input stage in FIG. 3 includes the additional transistor 16′ having its collector 19′ connected to the collector 19 of transistor 16 and its base 18′ connected to the emitter 20 of transistor 16. The emitter 20′ is connected to the common point 43. In a similar manner, and to balance the input stage, the feedback stage includes additional transistor 30′ having its collector 33′ and its base 32′ connected respectively to collector 33 and emitter 34 of transistor 30. The emitter 34′ is connected to the common point 43. Diode 57 is provided to compensate for the base-emitter voltage drop of transistor 30 and in a similar manner diode 57 is provided to compensate for the base-emitter voltage drop of transistor 30′.

The relationship of the resistors shown is identical to that demonstrated with respect to FIG. 2, that is, the value of resistor 25 times the value of resistor 56 is equal to twice the value of the common resistor 41 times the value of resistor 51.

The circuit of FIG. 3 has been constructed and tested and comprises an epitaxial silicon substrate into which the npn and pnp transistors of FIG. 3 were incorporated. Diffused resistors were used. Alternatively, thin film tantalum could be deposited on the silicon substrate to form the various resistors. By way of example a typical circuit illustrated in FIG. 3, designed for a frequency of from DC to 20 kg. would have the following values:

| | | |
|---|---|---|
| Resistor **25** | ohms | 4K |
| Resistor **37** | do | 4K |
| Resistor **51** | do | 4K |
| Resistor **41** | do | 16K |
| Resistor **56** | do | 32K |
| V+ | volts | 3 |
| V at point **23** | do | −12 |
| Input voltage | do | 0 to −6.4 |
| Input impedance | megohms | 10 |
| Output impedance | ohms | 1000 |
| Power dissipation | milliwatts | 20 |

Figure 4:
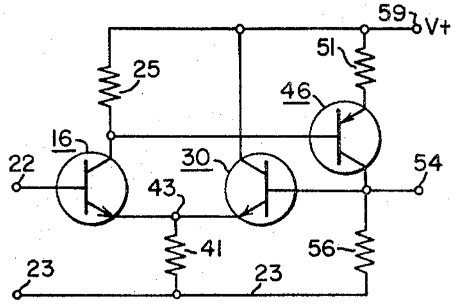
FIG. 4 illustrates still another embodiment of the present invention.

FIG. 4 illustrates an embodiment of the invention for a buffer amplifier which will provide an output signal with a somewhat lesser tolerance than that illustrated in FIGS. 2 and 3. The components of the circuit in FIG. 4 are the same as that shown in FIG. 2. The circuit of FIG. 4 however does not include the offset voltage diodes 26 or 57 nor does the second current path include resistor 37 or diode 38.

Although the present invention has been described with a certain degree of particularity, it should be understood that the present disclosure has been made by way of example and that modifications and variations of the circuits shown are made possible in the light of the above teachings.

What is claimed is:

1. An amplifier comprising:
an input stage for providing out-of-phase output signals in response to input signals applied thereto;
a phase inverter stage connected to receive the out-of-phase output signal from said input stage for providing an in-phase output signal;
a feedback stage connected to receive said in-phase output signal for providing a feedback signal to said input stage;
a first current path including a first resistor and said input stage;
a second current path including a second resistor and said feedback stage;
a common resistor connecting both said first and second current paths to a point of reference potential;
a third current path including a third resistor, said phase inverter stage and a fourth resistor serially arranged;
means connecting each said current path to a source of operating potential;
said third current path being connected to said point of reference potential;
said first, third, fourth and common resistors having values such that the value of said first times the value of said fourth resistors substantially equals twice the value of said common, times the value of said third resistors.

2. An amplifier comprising:
an input stage for providing output signals in response to input signals thereto and including a plurality of transistors each having base collector and emitter electrodes, the collectors of the transistors being connected together and emitter of a previous transistor being connected to the base of a subsequent transistor;
a phase inverter stage connected to receive the output signal from said input stage for providing an in-phase output signal;
a feedback stage connected to receive said in-phase output signal for providing a feedback signal to said input stage and including a plurality of transistors each having base collector and emitter electrodes, the collectors of the transistors being connected together and the emitter of a previous transistor being connected to the base of a subsequent transistor;
a first current path including a first resistor, a first diode and said input stage, serially arranged;
a second current path including a second resistor and said feedback path serially arranged;
a common resistor connecting both said first and second current paths to a point of reference potential;
an output junction;
the output of said phase inverter stage and the input of said feedback stage being connected to said output junction;
circuit means including a plurality of diodes and a resistor serially arranged;
said circuit means being connected between said output junction and said point of reference potential.

3. An amplifier according to claim 2 wherein the plurality of diodes in the circuit means is equal to the number of transistors in the feedback stage.

4. An amplifier according to claim 2 which includes a third resistor in series with the phase inverter stage with the values of the resistors being such that the value of the first times the value of the resistor in the circuit means substantially equals twice the value of the common times the value of the third resistor.

5. An amplifier comprising:
an input transistor for receiving input signals and including a base, collector and emitter electrode;
a phase inverter transistor, including base, collector and emitter electrodes, and connected to receive the output signal from said input transistor for providing an in-phase output signal;
a feedback transistor including base, collector and emitter electrodes, and connected to receive to said in-phase output signal for providing a feedback signal to the emitter of said input transistor;
a resistor connecting the emitter of said feedback transistor to a point of reference potential;
circuit means including impedance means connecting the base of said feedback and the collector of said phase inverter transistors to a point of reference potential; and
means for applying bias potential to said transistors.

6. A buffer amplifier comprising:
first and second signal translating devices each including an input, output and common electrode and having their common electrodes connected to a common point;
a common resistor connected to said common point and a point of reference potential;
a third signal translating device including an input, output and common electrode;
a first current path including a first resistor and a first diode serially connected with the output-common electrode path of said first signal translating device;
a second current path including a second resistor and a second diode serially connected with the output-common electrode path of said second signal translating device;
a third current path including a third resistor serially connected with the common-output electrode path of said third signal translating device;
an output junction;
connecting means connecting the output electrode of said first signal translating device to the input electrode of said third signal translating device;
connecting means connecting the input of said second signal translating device to the output of said third signal translating device and to said output junction;
a fourth resistor and third diode serially connected between said output junction and said point of reference potential.

7. A buffer amplifier comprising:
a first transistor having a base electrode for receiving input signals and a collector and emitter electrode;
a second transistor having base, collector and emitter electrodes;
the emitter electrodes of said first and second transistor being connected to a common point;
a common resistor connected to said common point and a point of reference potential;
an output junction;
a third transistor having base, collector and emitter electrodes and having its base connected to the collector of said first transistor for providing a phase inverted reproduction of the signal provided by said first transistor;
the collector of said third transistor and base of said second transistor being connected to said output junction;
a current path from said output junction to said point of reference potential; and
means for connecting the collectors of said first and second transistors and the emitter of said third transistor to a source of operating potential.

8. A buffer amplifier comprising:
a first and second transistor each including a base, collector and emitter electrode and having their emitter electrodes connected to a common point;
a common resistor connected to said common point and a point of reference potential;
a first resistor and diode serially connected in the collector-emitter path of said first transistor;
a second resistor and diode serially connected in the collector-emitter path of said second transistor;
an output junction;
a third transistor including a base, collector and emitter electrode and having its base electrode connected to the collector electrode of said first transistor and its collector electrode connected to said output junction;
the base of said second transistor being connected to said output junction;
a third resistor connected in the emitter-collector path of said third transistor;
a fourth resistor and diode serially connected between said output junction and said point of reference potential; and
means for connecting said transistors to a source of operating potential.

9. A buffer amplifier according to claim 8 wherein:
the first, third, fourth and common resistors have values such that the value of said first times the value of said fourth resistors substantially equals twice the value of said common, times the value of said third resistors.

References Cited

UNITED STATES PATENTS

| | | | |
|---|---|---|---|
| 2,892,165 | 6/1959 | Lindsay | 330—24 X |
| 3,296,546 | 1/1967 | Schneider | 330—85 |

FOREIGN PATENTS

| | | |
|---|---|---|
| 708,299 | 5/1954 | Great Britain. |

OTHER REFERENCES

Jones, Efficient, High Quality Program Amplifier Circuits Using the Industrial Silicon Series ZN2107, ZN2108 and ZN2196: General Electric Co., Application Note 90.3, pp. 5 and 6, April 1962.

ROY LAKE, *Primary Examiner.*

L. J. DAHL, *Assistant Examiner.*